United States Patent
Ohashi et al.

(10) Patent No.: US 10,866,513 B2
(45) Date of Patent: Dec. 15, 2020

(54) PHOTOCURABLE RESIN COMPOSITION

(71) Applicant: NISSAN CHEMICAL INDUSTRIES, LTD., Tokyo (JP)

(72) Inventors: Takuya Ohashi, Toyama (JP); Tomoyuki Enomoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 47 days.

(21) Appl. No.: 15/739,808

(22) PCT Filed: Jun. 15, 2016

(86) PCT No.: PCT/JP2016/067824
§ 371 (c)(1),
(2) Date: Dec. 26, 2017

(87) PCT Pub. No.: WO2016/208472
PCT Pub. Date: Dec. 29, 2016

(65) Prior Publication Data
US 2018/0362696 A1    Dec. 20, 2018

(30) Foreign Application Priority Data

Jun. 26, 2015  (JP) .................. 2015-129172

(51) Int. Cl.
| | | |
|---|---|---|
| G03F 7/031 | (2006.01) |
| G03F 7/038 | (2006.01) |
| C08L 67/07 | (2006.01) |
| C08J 3/24 | (2006.01) |
| C08F 299/00 | (2006.01) |
| C09D 4/06 | (2006.01) |
| C08F 290/04 | (2006.01) |
| C08F 290/06 | (2006.01) |
| C09D 151/08 | (2006.01) |
| C09J 151/08 | (2006.01) |

(Continued)

(52) U.S. Cl.
CPC ........ *G03F 7/0384* (2013.01); *C08F 290/046* (2013.01); *C08F 290/061* (2013.01); *C08F 290/062* (2013.01); *C08F 290/065* (2013.01); *C08F 299/00* (2013.01); *C08J 3/24* (2013.01); *C09D 4/06* (2013.01); *C09D 151/08* (2013.01); *C09J 151/08* (2013.01); *G03F 7/0005* (2013.01); *G03F 7/038* (2013.01); *G03F 7/039* (2013.01); *G03F 7/0388* (2013.01); *G03F 7/162* (2013.01); *G03F 7/168* (2013.01); *G03F 7/2004* (2013.01); *G03F 7/32* (2013.01); *G03F 7/38* (2013.01); *C08L 67/07* (2013.01)

(58) Field of Classification Search
CPC ........ G03F 7/031; G03F 7/032; G03F 7/0388; G03F 7/30; G03F 7/0384; G03F 7/38; C08G 63/199; C08G 63/47; C08G 63/52; C08G 63/54; C08G 63/553; C08G 63/685; C08G 63/918; C08L 67/07; C08L 79/00

USPC .... 430/287.1, 325; 525/31, 32.1, 43, 47, 48, 525/540

See application file for complete search history.

(56) References Cited

U.S. PATENT DOCUMENTS

| | | | | |
|---|---|---|---|---|
| 8,557,893 B2 * | 10/2013 | Yang | .................... | A61K 6/0023 523/116 |
| 2006/0173142 A1 * | 8/2006 | Nava | ........................ | C08F 8/30 525/540 |

(Continued)

FOREIGN PATENT DOCUMENTS

| | | |
|---|---|---|
| JP | 2008-143954 A | 6/2008 |
| JP | 2009-093162 A | 4/2009 |

(Continued)

OTHER PUBLICATIONS

Aug. 2, 2016 International Search Report issued in International Patent Application No. PCT/JP2016/067824.

(Continued)

*Primary Examiner* — John S Chu
(74) *Attorney, Agent, or Firm* — Oliff PLC

(57) ABSTRACT

A novel photocurable resin composition including: a polymer with a weight average molecular weight of 1,000 to 50,000, the polymer having a structural unit of formula (1), and having a structure of formula (2) at an end: wherein X is a $C_{1-6}$ alkyl group, vinyl group, allyl group, or glycidyl group; m and n are each independently 0 or 1; Q is a divalent hydrocarbon group having a carbon atom number of 1 to 16; Z is a divalent linking group having a carbon atom number of 1 to 4, wherein the divalent linking group is attached to the —O— group in formula (1); and $R^1$ is a hydrogen atom or methyl group; a radical photopolymerization initiator; and a solvent.

(1)

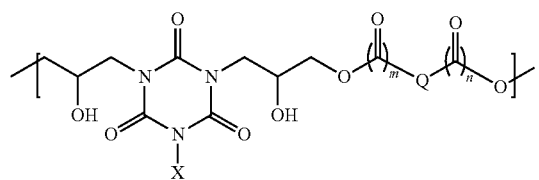

(2)

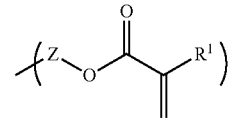

6 Claims, No Drawings

(51) Int. Cl.
*G03F 7/00* (2006.01)
*G03F 7/039* (2006.01)
*G03F 7/16* (2006.01)
*G03F 7/20* (2006.01)
*G03F 7/32* (2006.01)
*G03F 7/38* (2006.01)

(56) References Cited

U.S. PATENT DOCUMENTS

| | | | | |
|---|---|---|---|---|
| 2015/0094420 A1* | 4/2015 | Nishimura | ............ | C09D 179/04 |
| | | | | 524/612 |
| 2015/0115247 A1* | 4/2015 | Nishimura | ......... | C08G 73/0273 |
| | | | | 257/40 |
| 2016/0017145 A1* | 1/2016 | Maeda | ................. | C09D 179/04 |
| | | | | 525/436 |
| 2016/0160079 A1* | 6/2016 | Shikauchi | .......... | C08G 73/0644 |
| | | | | 524/612 |

FOREIGN PATENT DOCUMENTS

| | | |
|---|---|---|
| JP | 4705311 B2 | 6/2011 |
| JP | 2013-541524 A | 11/2013 |
| WO | 2007/148627 A1 | 12/2007 |
| WO | 2013/035787 A1 | 3/2013 |

OTHER PUBLICATIONS

Aug. 2, 2016 Written Opinion of the International Searching Authority issued in International Patent Application No. PCT/JP2016/067824.

* cited by examiner

PHOTOCURABLE RESIN COMPOSITION

TECHNICAL FIELD

The present invention relates to a photocurable resin composition comprising a polymer into which a radical crosslinkable moiety has been introduced.

BACKGROUND ART

With the recent high performance and compactness of electronic devices such as mobile phones and IC cards, a higher degree of integration of semiconductor devices has been required. To achieve this, miniaturization of semiconductor elements or a stacked structure in which semiconductor elements are vertically stacked has been studied. For producing such a stacked structure, an adhesive is used to join the semiconductor elements. However, known adhesives such as acrylic resins, epoxy resins, and silicone resins have heat resistance up to only around 250° C., and thus, cannot be used in a step that requires a high temperature of 250° C. or above, such as electrode joining of metal bumps or an ion diffusion step.

Patent Document 1 discloses an isocyanurate ring-containing polymer for use as an adhesive for optical semiconductors and a composition containing the polymer. This document discloses that the isocyanurate ring-containing polymer is obtained by the reaction between an N-mono-substituted isocyanuric acid and a dihalogenated compound in the presence of an alkali metal compound, or the hydrosilylation reaction between an N,N',N''-trisubstituted isocyanuric acid and a silane compound. This document also discloses that the composition can be bonded as an adhesive for optical semiconductors by heating for 30 minutes to 4 hours in an oven at 50 to 250° C.

The market for flat panel displays (FPDs) such as liquid crystal displays (LCDs) and organic EL (OLED) displays is rapidly expanding. Liquid crystal displays use glass substrates as base materials of display panels; however, flexible displays that use plastic substrates have been developed with a view toward reducing the thickness and weight, achieving flexibility, and reducing processing costs by employing roll-to-roll processes. However, PET resins, PEN resins, and PC resins known as resin materials that are used as known plastic substrates have heat resistance up to only around 250° C., and thus, cannot be used in a step requiring a high temperature of 250° C. or above that has been conventionally required in processes for forming thin film transistors (TFTs).

Patent Document 2 discloses a composition that provides a cured film having high visible light transmittance as well as excellent heat resistance and solvent resistance. This document also discloses that the composition can also be used as an adhesive.

PRIOR ART DOCUMENTS

Patent Documents

Patent Document 1: Japanese Patent Application Publication No. 2008-143954 (JP 2008-143954 A)
Patent Document 2: WO 2013/035787 A1

SUMMARY OF THE INVENTION

Problem to be Solved by the Invention

The light transmittance of a cured product produced from the composition disclosed in Patent Document 1 was evaluated as 90% or more at 470 nm. The heat resistance of the cured product was also evaluated. Although this document discloses that the transmittance at 470 nm was measured after the cured product was left for 120 hours in an oven at 150° C., the heat resistance at a temperature of 250° C. or above is unknown. Thus, if the composition disclosed in Patent Document 1 is used in a step that requires a high temperature of 250° C. or above, the cured product obtained from the composition may not have high visible light transmittance.

In order to form a cured film having high visible light transmittance as well as excellent heat resistance and solvent resistance on a substrate by using the composition disclosed in Patent Document 2, the composition needs to be baked for 5 minutes, for example, at a temperature of 200° C. or above. Thus, if the composition disclosed in Patent Document 2 is used to bond a known plastic substrate, the plastic substrate may be damaged during baking of the composition.

Thus, there is a need for a composition that does not require a heating step at a temperature of 200° C. or above, and can form a cured film having high visible light transmittance, as well as excellent heat resistance and solvent resistance.

Means for Solving the Problem

As a result of diligent study to solve the aforementioned problem, the present inventors have found that a cured film having desired properties can be formed from a composition, when a terminal structure of a polymer forming the composition is designed such that a heating step at the above-mentioned temperatures is not required.

A first aspect of the present invention provides a photocurable resin composition comprising:

a polymer with a weight average molecular weight of 1,000 to 50,000, the polymer having a structural unit of formula (1), and having a structure of formula (2) at an end:

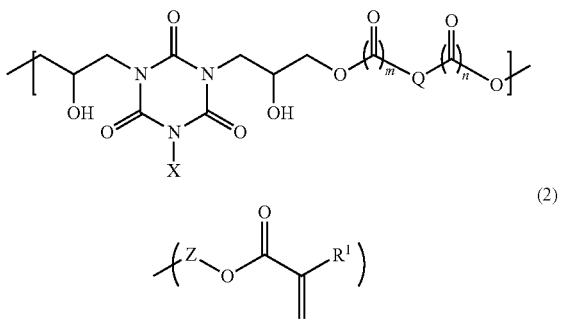

(wherein X is a $C_{1-6}$ alkyl group, vinyl group, allyl group, or glycidyl group; m and n are each independently 0 or 1; Q is a divalent hydrocarbon group having a carbon atom number of 1 to 16; Z is a divalent linking group having a carbon atom number of 1 to 4, wherein the divalent linking group is attached to the —O— group in formula (1); and $R^1$ is a hydrogen atom or methyl group);

a radical photopolymerization initiator; and a solvent.

The divalent hydrocarbon group of Q in formula (1) is, for example, a linear or branched alkylene group, a group containing two carbon atoms connected by a double bond, or a group containing, in a main chain, an alicyclic hydrocarbon group or aromatic hydrocarbon group optionally having at least one substituent.

The divalent linking group of Z in formula (2) is, for example, a linear or branched alkylene group optionally having at least one hydroxy group as a substituent.

The photocurable resin composition may further comprise a bifunctional (meth)acrylate and/or a polyfunctional thiol.

The photocurable resin composition is usable as an adhesive or a lens material.

A second aspect of the present invention provides a method for forming a film comprising the steps of:

applying the photocurable resin composition according to the first aspect of the present invention onto a substrate;

pre-baking the photocurable resin composition applied onto the substrate at a temperature of 50 to 160° C.;

exposing a coating film formed on the substrate after the pre-baking to light; and developing the coating film.

Effects of the Invention

The photocurable resin composition of the present invention comprises a polymer in which a radical crosslinkable moiety has been introduced at an end, as well as a radical photopolymerization initiator, and thus, can form a cured film having high visible light transmittance as well as excellent heat resistance and solvent resistance, without requiring a heating step at a temperature of 200° C. or above. This cured film is useful as a lens material. The cured film formed from the photocurable resin composition of the present invention also has excellent anti-moisture permeation properties. The photocurable resin composition of the present invention has high adhesion, and thus, is also useful as an adhesive for organic EL displays and image sensors.

MODES FOR CARRYING OUT THE INVENTION

<Polymer>

The photocurable resin composition of the present invention comprises a polymer with a weight average molecular weight of 1,000 to 50,000, which has a structural unit of formula (1), and has a structure of formula (2) at an end. The weight average molecular weight is determined by the below-described gel permeation chromatography (hereinafter abbreviated to GPC) analysis relative to standard polystyrene. The weight average molecular weight is preferably 1,000 to 20,000.

Examples of the $C_{1-6}$ alkyl group of X in formula (1) include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

The divalent hydrocarbon group of Q having a carbon atom number of 1 to 16 in formula (1) is, for example, a linear or branched alkylene group, a group containing two carbon atoms connected by a double bond, or a group containing, in a main chain, an alicyclic hydrocarbon group or aromatic hydrocarbon group optionally having at least one substituent. Examples of such groups include groups of formulas (a) to (m):

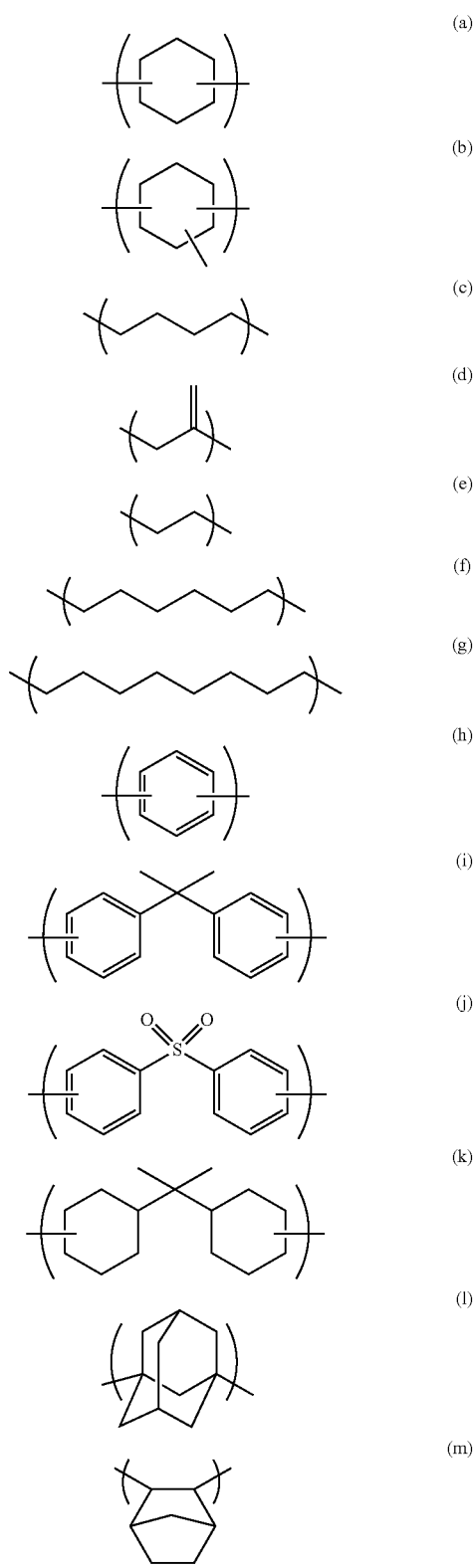

The divalent linking group having a carbon atom number of 1 to 4 of Z in formula (2) is, for example, a linear or branched alkylene group optionally having at least one hydroxy group as a substituent. Where Z is such an alkylene group, examples of the terminal structure of formula (2) include structures of formulas (2-1) and (2-2):

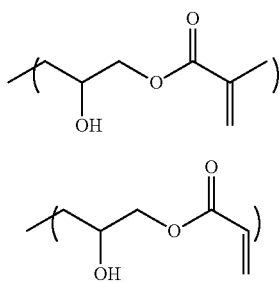

The polymer is synthesized through, for example, the following process: A diepoxy compound having a triazinetrione structure and a compound having a carboxyl or hydroxy group at an end are reacted to produce a polymer intermediate having a structural unit of formula (1) and having a carboxyl or hydroxy group at an end. The polymer intermediate having such an end is subsequently reacted with a (meth)acrylate having an epoxy group.

<Radical Photopolymerization Initiator>

The photocurable resin composition of the present invention comprises a radical photopolymerization initiator. The photopolymerization initiator is not limited to particular photopolymerization initiators, so long as it is a compound that shows absorption in the wavelength range of the light source used for photocuring. Examples of the photopolymerization initiator include organic peroxides such as tert-butylperoxy-iso-butyrate, 2,5-dimethyl-2,5-bis(benzoyldioxy)hexane, 1,4-bis[α-(tert-butyldioxy)-iso-propoxy]benzene, di-tert-butylperoxide, 2,5-dimethyl-2,5-bis(tert-butyldioxy)hexenehydroperoxide, α-(iso-propylphenyl)-iso-propylhydroperoxide, tert-butylhydroperoxide, 1,1-bis(tert-butyldioxy)-3,3,5-trimethylcyclohexane, butyl-4,4-bis(tert-butyldioxy)valerate, cyclohexanone peroxide, 2,2',5,5'-tetra(tert-butylperoxycarbonyl)benzophenone, 3,3,4,4'-tetra(tert-butylperoxycarbonyl)benzophenone, 3,3,4,4'-tetra(tert-amylperoxycarbonyl)benzophenone, 3,3,4,4'-tetra(tert-hexylperoxycarbonyl)benzophenone, 3,3'-bis(tert-butylperoxycarbonyl)-4,4'-dicarboxybenzophenone, tert-butyl peroxybenzoate, and di-tert-butyldiperoxyisophthalate; quinones such as 9,10-anthraquinone, 1-chloroanthraquinone, 2-chloroanthraquinone, octamethylanthraquinone, and 1,2-benzanthraquinone; benzoin derivatives such as benzoin methyl, benzoin ethyl ether, α-methylbenzoin, and α-phenylbenzoin; alkylphenone-based compounds such as 2,2-dimethoxy-1,2-diphenylethan-1-one, 1-hydroxy-cyclohexyl-phenyl-ketone, 2-hydroxy-2-methyl-1-phenyl-propan-1-one, 1-[4-(2-hydroxyethoxy)-phenyl]-2-hydroxy-2-methyl-1-propan-1-one, 2-hydroxy-1-[4-{4-(2-hydroxy-2-methyl-propionyl)benzyl}-phenyl]-2-methyl-propan-1-one, phenylglyoxylic acid methyl ester, 2-methyl-1-[4-(methylthio)phenyl]-2-morpholinopropan-1-one, 2-benzyl-2-dimethylamino-1-(4-moipholinophenyl)-1-butanone, and 2-dimethylamino-2-(4-methyl-benzyl)-1-(4-morpholin-4-yl-phenyl)-butan-1-one; acylphosphine oxide-based compounds such as bis(2,4,6-trimethylbenzoyl)-phenylphosphine oxide and 2,4,6-trimethylbenzoyl-diphenyl-phosphine oxide; and oxime ester-based compounds such as 2-(O-benzoyloxime)-1-[4-(phenylthio)phenyl]-1,2-octanedione and 1-(O-acetyloxime)-1-[9-ethyl-6-(2-methylbenzoyl)-9H-carbazol-3-yl]ethanone.

The radical photopolymerization initiator is commercially available, and examples thereof include IRGACURE [registered trademark] 651, 184, 2959, 127, 907, 369, 379EG, 819, 819DW, 1800, 1870, 784, OXE01, OXE02, 250, 1173, MBF, TPO, 4265 and TPO (all from BASF Japan Ltd.); KAYACURE [registered trademark] DETX, MBP, DMBI, EPA and OA (all from Nippon Kayaku Co., Ltd.); VICURE-10 and -55 (both from STAUFFER Co. LTD); ESACURE KIP150, TZT, 1001, KT046, KB1, KL200, KS300 and EB3, Triazine-PMS, Triazine A and Triazine B (all from Japan Siber-Hegner KK); and ADEKA OPTOMER N-1717, N-1414 and N-1606 (all from ADEKA CORPORATION). These radical photopolymerization initiators may be used alone or in combination of two or more.

The amount of the radical photopolymerization initiator contained in the photocurable resin composition of the present invention is, for example, 0.01 to 30 phr, and preferably 0.1 to 15 phr, based on the amount of the polymer. If this proportion falls below the lower limit, sufficient curability cannot be achieved. As used herein, "phr" refers to the mass of the radical photopolymerization initiator based on a mass of 100 g of the polymer.

<Solvent>

The photocurable resin composition of the present invention comprises a solvent. The solvent is not limited to particular solvents, so long as it is an organic solvent that can be used in manufacturing processes of semiconductor devices. Examples of the solvent include ketones such as cyclohexanone, methyl isoamyl ketone, 2-butanone, and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, and dipropylene glycol monoacetate, as well as their monomethyl ethers, monoethyl ethers, monopropyl ethers, monobutyl ethers, and monophenyl ethers; cyclic ethers such as dioxane; lactones such as γ-butyrolactone; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents may be used alone or as a mixture of two or more. When the components of the photocurable resin composition of the present invention excluding the solvent are defined as solids, the proportion of the solids in the photocurable resin composition is 1 to 80% by mass, for example.

<Crosslinkable Compound>

The photocurable resin composition of the present invention may contain a bifunctional (meth)acrylate as a crosslinkable compound, as required. As used herein, the "bifunctional (meth)acrylate" refers to a compound having acryloyl or methacryloyl groups at both ends of the molecule. Examples of the compound include tricyclodecanedimethanol diacrylate, tricyclodecanedimethanol dimethacrylate, tricyclodecanediethanol diacrylate, and tricyclodecanediethanol dimethacrylate.

The bifunctional (meth)acrylate is commercially available, and examples thereof include A-DCP and DCP (both from Shin Nakamura Chemical Co., Ltd.). These compounds may be used alone or in combination of two or more.

The amount of the bifunctional (meth)acrylate contained in the photocurable resin composition of the present invention is, for example, 5 to 50% by mass, and preferably 10 to 30% by mass, based on the amount of the polymer.

The photocurable resin composition of the present invention may further contain a polyfunctional thiol as a crosslinkable compound, as required. As used herein, the "polyfunctional thiol" refers to a compound having a plurality of (for example, two, three, or four) thiol groups at ends of the molecule. Examples of the compound include pentaerythritol tetrakis(3-mercaptobutyrate), 1,4-bis(3-mercaptobutyryloxy)butane, 1,3,5-tris(3-mercaptobutyryloxyethyl)-1,3,5-triazine-2,4,6(1H,3H,5H)-trione, trimethylolpropane tris(3-mercaptobutyrate), and trimethylolethane tris(3-mercaptobutyrate).

The polyfunctional thiol is commercially available, and examples thereof include Karenz MT [registered trademark] PE1, BD1 and NR1 (all from Showa Denko K.K.). These compounds may be used alone or in combination of two or more.

The amount of the polyfunctional thiol contained in the photocurable resin composition of the present invention is, for example, 0.1 to 15% by mass, and preferably 0.5 to 10% by mass, based on the amount of the polymer.

<Other Additives>

The photocurable resin composition of the present invention may further comprise additives such as an epoxy compound, a photoacid generator, a thermal acid generator, an inorganic filler, and a surfactant, as required.

When the photocurable resin composition of the present invention contains an epoxy compound, examples of the epoxy compound include 1,4-butanediol diglycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris[p-(2,3-epoxypropoxy)phenyl] propane, 1,2-cyclohexanedicarboxylic acid diglycidyl ester, 4,4'-methylenebis(N,N-diglycidylaniline), 3,4-epoxycyclohexylmethyl-3,4-epoxycyclohexane carboxylate, trimethylolethane triglycidyl ether, triglycidyl-p-aminophenol, tetraglycidyl meta-xylene diamine, tetraglycidyl diaminodiphenylmethane, tetraglycidyl-1,3-bisaminomethylcyclohexane, bisphenol-A-diglycidyl ether, bisphenol-S-diglycidyl ether, pentaerythritol tetraglycidyl ether, resorcinol diglycidyl ether, phthalic acid diglycidyl ester, neopentyl glycol diglycidyl ether, polypropylene glycol diglycidyl ether, tetrabromobisphenol-A-diglycidyl ether, bisphenol hexafluoroacetone diglycidyl ether, pentaerythritol diglycidyl ether, tris-(2,3-epoxypropyl)isocyanurate, monoallyl diglycidyl isocyanurate, diglycerol polydiglycidyl ether, pentaerythritol polyglycidyl ether, 1,4-bis(2,3-epoxypropoxyperfluoroisopropyl)cyclohexane, sorbitol polyglycidyl ether, trimethylolpropane polyglycidyl ether, resorcin diglycidyl ether, 1,6-hexanediol diglycidyl ether, polyethylene glycol diglycidyl ether, phenyl glycidyl ether, p-tert-butylphenyl glycidyl ether, adipic acid diglycidyl ether, o-phthalic acid diglycidyl ether, dibromophenyl glycidyl ether, 1,2,7,8-diepoxyoctane, 1,6-dimethylol perfluorohexane diglycidyl ether, 4,4$^1$-bis(2,3-epoxypropoxyperfluoroisopropyl)diphenyl ether, 2,2-bis(4-glycidyloxyphenyl) propane, 3,4-epoxycyclohexylmethyl-3,4'-epoxycyclohexane carboxylate, 3,4-epoxycyclohexyloxirane, 2-(3,4-epoxycyclohexyl)-3,4'-epoxy-1,3-dioxane-5-spirocyclohexane, 1,2-ethylenedioxybis(3,4-epoxycyclohexylmethane), 4,5'-epoxy-2'-methylcyclohexylmethyl-4,5-epoxy-2-methylcyclohexane carboxylate, ethylene glycol-bis(3,4-epoxycyclohexane carboxylate, bis(3,4-epoxycyclohexylmethyl) adipate, and bis (2,3-epoxycyclopentyl) ether. Examples of the epoxy compound also include (meth)acrylate copolymers having epoxy groups, such as glycidyl acrylate and glycidyl methacrylate.

The epoxy compound is commercially available, and examples thereof include EPOLEAD [registered trademark] GT-401, GT-403, GT-301, GT-302 and PB3600, CELLOXIDE [registered trademark] 2021P, 2000, 3000, EHPE3150 and EHPE3150CE, CYCLOMER [registered trademark] M100 (all from Daicel Corporation), EPICLON [registered trademark] 840, 840-S, N-660 and N-673-80M (all from DIC Corporation).

When the photocurable resin composition of the present invention contains a photoacid generator, examples of the photoacid generator include IRGACURE [registered trademark] PAG103, PAG108, PAG121, PAG203, CGI725 and GSID-26-1 (all from BASF Ltd.), WPAG-145, WPAG-170, WPAG-199, WPAG-281, WPAG-336 and WPAG-367 (all from Wako Pure Chemical Industries, Ltd.), TFE-Triazine, TME-Triazine, MP-Triazine, Dimethoxy-triazine, TS-91 and TS-01 (all from Sanwa Chemical Co., Ltd.).

When the photocurable resin composition of the present invention contains a thermal acid generator, examples of the thermal acid generator include K-PURE [registered trademark] TAG-2689, TAG-2690, TAG-2700, CXC-1612, CXC-1614, CXC-1615 and CXC-1821 (all from King Industries, Inc.).

When the photocurable resin composition of the present invention contains an inorganic filler, examples of the inorganic filler include sols such as silica, aluminum nitride, boron nitride, zirconia, and alumina.

When the photocurable resin composition of the present invention contains a surfactant, examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octylphenyl ether and polyoxyethylene nonylphenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate.

The surfactant is commercially available, and examples thereof include fluorosurfactants such as EFTOP [registered trademark] EF301, EF303 and EF352 (all from Mitsubishi Materials Electronic Chemicals Co., Ltd.), MEGAFACE [registered trademark] F171, F173, R-30, R-30N, R-40 and R-40-LM (all from DIC Corporation), Fluorad FC430 and FC431 (all from Sumitomo 3M Co., Ltd.), AsahiGuard [registered trademark] AG710, Surfion [registered trademark] S-382, SC101, SC102, SC103, SC104, SC105 and SC106 (all from Asahi Glass Co., Ltd.); and organosiloxane polymer KP341 (from Shin-Etsu Chemical Co., Ltd.). These surfactants may be used alone or in combination of two or more.

<Method for Forming Film>

A cured film can be formed using the photocurable resin composition of the present invention, through the following steps: applying the photocurable resin composition of the present invention onto a substrate; pre-baking the photocurable resin composition applied onto the substrate at a temperature of 50 to 160° C.; exposing a coating film formed on the substrate after the pre-baking to light; and developing the coating film.

Examples of methods for applying the photocurable resin composition of the present invention to the substrate include a spin coating method, a potting method, a dipping method, a flow coating method, an ink-jet method, a spraying method, a bar coating method, a gravure coating method, a slit coating method, a roll coating method, a transfer printing method, a brush coating method, a blade coating method, and an air knife coating method.

Examples of the substrate to which the photocurable resin composition of the present invention is applied include silicon wafers coated with a silicon oxide film, a silicon nitride film, or a silicon oxynitride film; silicon nitride substrates; quartz substrates; alkali-free glass substrates; low-alkali glass substrates; crystallized glass substrates; glass substrates having an indium tin oxide (ITO) film or an indium zinc oxide (IZO) film formed thereon; and substrates formed of polyethylene terephthalate (PET), polyethylene naphthalate (PEN), triacetyl cellulose (TAC), polyethylene (PE), polyimide (PI), polyamide (PA), polyvinyl chloride (PVC), polycycloolefin (PCO), polyvinylidene chloride (PVDC), polyvinyl alcohol (PVA), polypropylene (PP), polycarbonate (PC), polystyrene (PS), polyacrylonitrile (PAN), ethylene-vinyl acetate copolymer (EVA), ethylene-vinyl alcohol copolymer (EVOH), ethylene-methacrylic acid copolymer (EMMA), or polymethacrylic acid (PMMA).

The pre-baking is performed to remove the solvent from the photocurable resin composition applied onto the substrate. As a result of this, a coating film in which the flowability of the composition has been lost is formed on the substrate.

After the step of exposing the coating film to light, and before the step of developing the coating film, post-exposure bake (abbreviated to PEB) may be performed at a temperature of, for example, 50 to 160° C., as required.

Examples of the light source to be used for exposing the coating film to light include g-line, h-line, i-line, ghi-line broadband, and a KrF excimer laser.

The developing solution to be used for developing the coating film is, for example, a solvent contained in the photocurable resin composition. Additionally, a known organic solvent may be used as the solvent of the photoresist solution to be used in a photolithography step. Examples of the organic solvent include propylene glycol 1-monomethyl ether 2-acetate, 1-methoxy-2-propanol, cyclohexanone, and 2-propanol. These organic solvents may be used alone or in combination of two or more.

EXAMPLES

The present invention will be hereinafter described in more detail based on examples; however, the present invention is not limited to these examples.

The GPC analysis of the polymer obtained in each of the synthesis examples shown below was performed with the following apparatus, under the following measurement conditions:

Apparatus: integral high-speed GPC system, HLC-8220GPC, from Tosoh Corporation
Columns: KF-G and KF804L
Column temperature: 40° C.
Solvent: tetrahydrofuran (THF)
Flow rate: 1.0 mL/min
Standard sample: polystyrene
Detector: RI Synthesis Example 1

80.45 g of 1,2-cyclohexanedicarboxylic acid, 110.00 g of monoallyl diglycidyl isocyanurate, and 4.52 g of benzyltriethylammonium chloride were dissolved in 292.46 g of propylene glycol 1-monomethyl ether 2-acetate, and then the mixture was reacted for 4 hours at 140° C. to give a solution containing a polymer. After cooling to room temperature, 18.05 g of glycidyl methacrylate and 0.72 g of benzyltriethylammonium chloride were dissolved in the solution, and then the mixture was reacted for 3 hours at 140° C. to give a solution containing a polymer. As a result of GPC analysis of the obtained polymer, the weight average molecular weight of the polymer was 2,700 relative to standard polystyrene. The obtained polymer is believed to be a polymer having a structural unit of formula (1a) and having a structure of formula (2a) at an end:

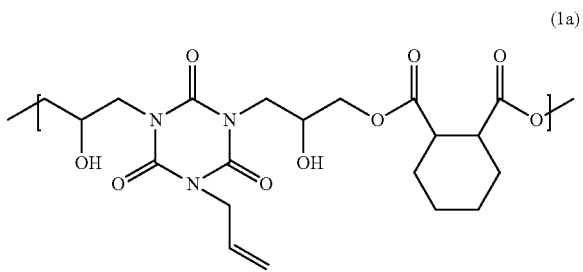

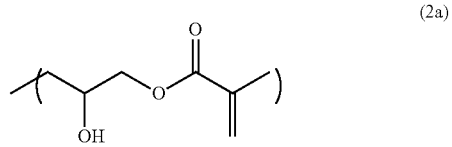

Synthesis Example 2

14.29 g of 4-methylcyclohexane-1,2-dicarboxylic anhydride, 20.00 g of monoallyl diglycidyl isocyanurate, and 0.82 g of benzyltriethylammonium chloride were dissolved in 105.33 g of cyclohexanone, and then the mixture was reacted for 4 hours at 140° C. to give a solution containing a polymer. After cooling to room temperature, 3.25 g of glycidyl methacrylate and 0.13 g of benzyltriethylammonium chloride were dissolved in the solution, and then the mixture was reacted for 3 hours at 140° C. to give a solution containing a polymer. As a result of GPC analysis of the obtained polymer, the weight average molecular weight of the polymer was 10,900 relative to standard polystyrene. The obtained polymer is believed to be a polymer having a structural unit of formula (1b) and having a structure of formula (2b) at an end:

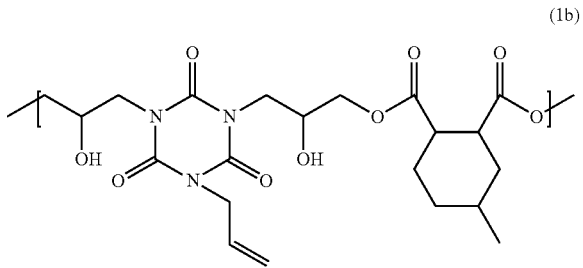

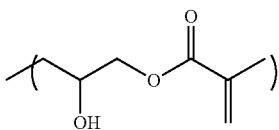

(2b)

Synthesis Example 3

18.24 g of 2-propene-1,2-dicarboxylic acid, 33.00 g of monoallyl diglycidyl isocyanurate, and 2.21 g of ethyltriphenylphosphonium bromide were dissolved in 124.71 g of cyclohexanone, and then the mixture was reacted for 4 hours at 140° C. to give a solution containing a polymer. After cooling to room temperature, 4.86 g of glycidyl methacrylate and 0.30 g of ethyltriphenylphosphonium bromide were dissolved in the solution, and then the mixture was reacted for 3 hours at 140° C. to give a solution containing a polymer. As a result of GPC analysis of the obtained polymer, the weight average molecular weight of the polymer was 3,900 relative to standard polystyrene. The obtained polymer is believed to be a polymer having a structural unit of formula (1c) and having a structure of formula (2c) at an end:

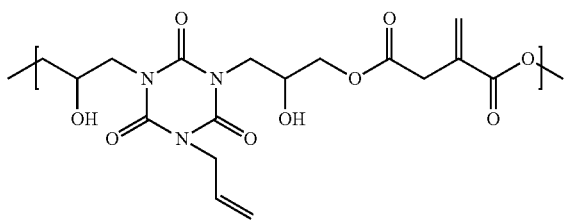

(1c)

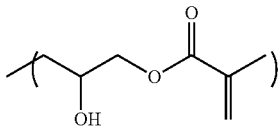

(2c)

Synthesis Example 4

20.48 g of 1,4-butanedicarboxylic acid, 33.00 g of monoallyl diglycidyl isocyanurate, and 2.21 g of ethyltriphenylphosphonium bromide were dissolved in 129.96 g of cyclohexanone, and then the mixture was reacted for 4 hours at 140° C. to give a solution containing a polymer. After cooling to room temperature, 5.07 g of glycidyl methacrylate and 0.30 g of ethyltriphenylphosphonium bromide were dissolved in the solution, and then the mixture was reacted for 3 hours at 140° C. to give a solution containing a polymer. As a result of GPC analysis of the obtained polymer, the weight average molecular weight of the polymer was 4,700 relative to standard polystyrene. The obtained polymer is believed to be a polymer having a structural unit of formula (1d) and having a structure of formula (2d) at an end:

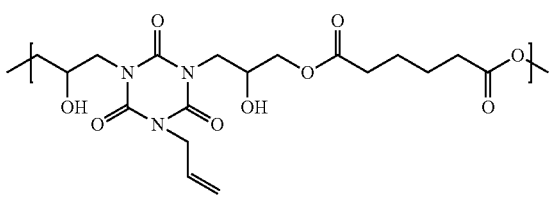

(1d)

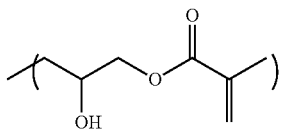

(2d)

Synthesis Example 5

25.00 g of 2,2-bis(4-glycidyloxycyclohexyl)propane, 11.35 g of 1,2-cyclohexanedicarboxylic acid, and 0.64 g of benzyltriethylammonium chloride were dissolved in 86.31 g of cyclohexanone, and then the mixture was reacted for 4 hours at 140° C. to give a solution containing a polymer. After cooling to room temperature, 13.78 g of glycidyl methacrylate and 0.55 g of benzyltriethylammonium chloride were dissolved in the solution, and then the mixture was reacted for 3 hours at 140° C. to give a solution containing a polymer. As a result of GPC analysis of the obtained polymer, the weight average molecular weight of the polymer was 3,100 relative to standard polystyrene. The obtained polymer is believed to be a polymer having a structural unit of formula (3) and having a structure of formula (2e) at an end:

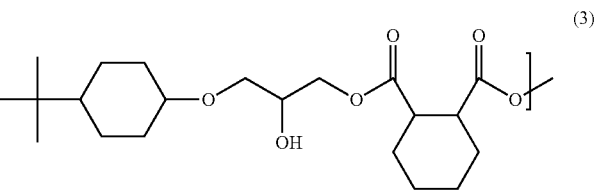

(3)

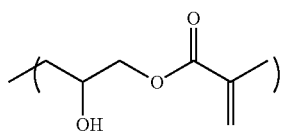

(2e)

Synthesis Example 6

22.11 g of 1,4-naphthalenedicarboxylic acid, 32.00 g of 2,2-bis(4-glycidyloxyphenyl)propane, and 0.99 g of benzyltriethylammonium chloride were dissolved in 82.65 g of propylene glycol 1-monomethyl ether 2-acetate, and then the mixture was reacted for 4 hours at 140° C. to give a solution containing a polymer. After cooling to room temperature, 6.41 g of glycidyl methacrylate and 0.26 g of benzyltriethylammonium chloride were dissolved in the solution, and then the mixture was reacted for 3 hours at 140° C. to give a solution containing a polymer. As a result of GPC analysis of the obtained polymer, the weight average molecular weight of the polymer was 4,400 relative to standard polystyrene. The obtained polymer is believed to be a polymer having a structural unit of formula (4) and having a structure of formula (2f) at an end:

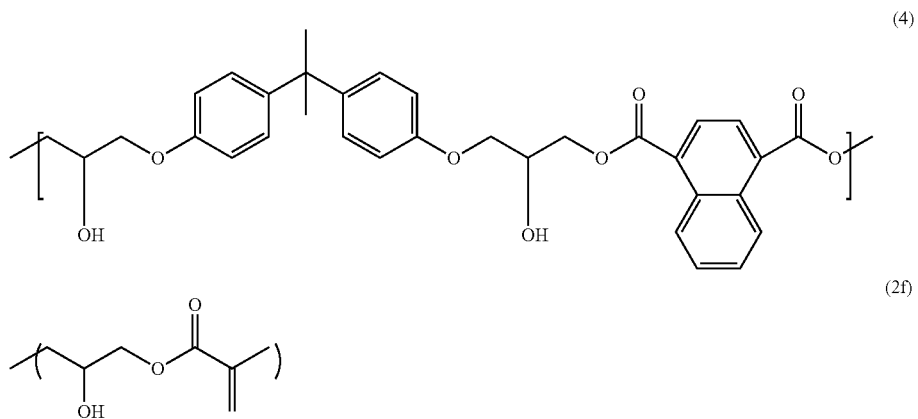

Synthesis Example 7

12.29 g of 2,5-pyridinedicarboxylic acid, 23.00 g of 2,2-bis(4-glycidyloxyphenyl)propane, and 0.71 g of benzyltriethylammonium chloride were dissolved in 107.99 g of cyclohexanone, and then the mixture was reacted for 4 hours at 140° C. to give a solution containing a polymer. After cooling to room temperature, 3.34 g of glycidyl methacrylate and 0.13 g of benzyltiethylammonium chloride were dissolved in the solution, and then the mixture was reacted for 3 hours at 140° C. to give a solution containing a polymer. As a result of GPC analysis of the obtained polymer, the weight average molecular weight of the polymer was 6,200 relative to standard polystyrene. The obtained polymer is believed to be a polymer having a structural unit of formula (5) and having a structure of formula (2g) at an end:

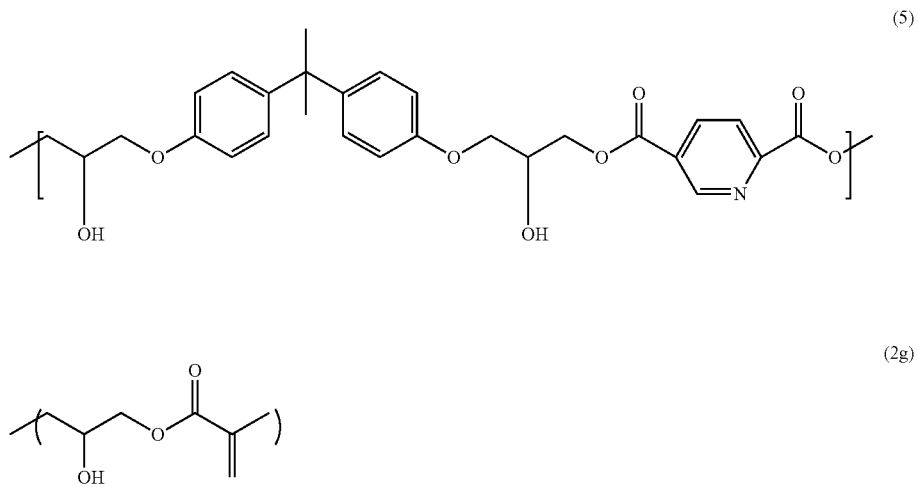

Synthesis Example 8

14.34 g of isophthalic acid, 27.00 g of 2,2-bis(4-glycidyloxyphenyl)propane, and 0.84 g of benzyltriethylammonium chloride were dissolved in 63.26 g of propylene glycol 1-monomethyl ether 2-acetate, and then the mixture was reacted for 4 hours at 140° C. to give a solution containing a polymer. As a result of GPC analysis of the obtained polymer, the weight average molecular weight of the polymer was 10,200 relative to standard polystyrene. The obtained polymer is believed to be a polymer that has a structural unit of formula (6), and is not end-capped with a structure having an acryloyl or methacryloyl group:

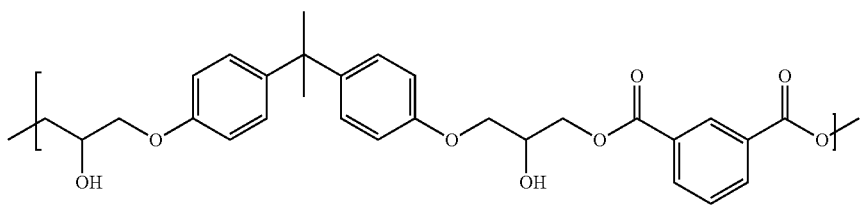

(6)

Synthesis Example 9

28.00 g of 2,2-bis(4-glycidyloxycyclohexyl)propane, 12.49 g of monoallyl isocyanurate, and 0.71 g of benzyltriethylammonium chloride were dissolved in 61.81 g of propylene glycol 1-monomethyl ether 2-acetate, and then the mixture was reacted for 4 hours at 140° C. to give a solution containing a polymer. As a result of GPC analysis of the obtained polymer, the weight average molecular weight of the polymer was 4,100 relative to standard polystyrene. The obtained polymer is believed to be a polymer having a structural unit of formula (7):

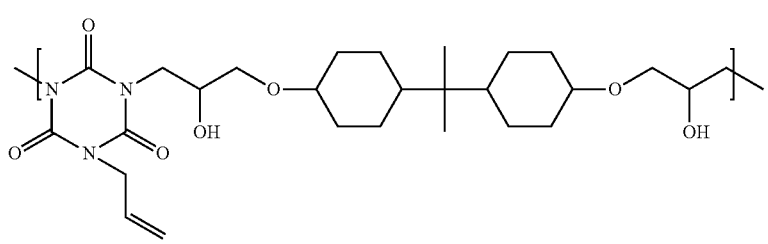

(7)

Synthesis Example 10

103.61 g of 1,2-cyclohexanedicarboxylic acid, 150.00 g of monoallyl diglycidyl isocyanurate, and 3.08 g of benzyltriethylammonium chloride were dissolved in 256.69 g of propylene glycol 1-monomethyl ether 2-acetate, and then the mixture was reacted for 4 hours at 140° C. to give a solution containing a polymer. As a result of GPC analysis of the obtained polymer, the weight average molecular weight of the polymer was 3,300 relative to standard polystyrene. The obtained polymer is believed to be a polymer having a structural unit of formula (Ia):

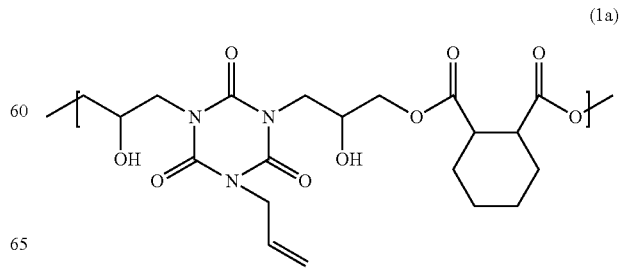

(Ia)

Synthesis Example 11

24.00 g of 2,2-bis(4-glycidyloxycyclohexyl)propane, 13.68 g of 1,4-naphthalenedicarboxylic acid, and 1.23 g of benzyltriethylammonium chloride were dissolved in 90.78 g of propylene glycol 1-monomethyl ether 2-acetate, and then the mixture was reacted for 4 hours at 140° C. to give a solution containing a polymer. After cooling to room temperature, 3.57 g of glycidyl methacrylate and 0.14 g of benzyltriethylammonium chloride were dissolved in the solution, and then the mixture was reacted for 3 hours at 140° C. to give a solution containing a polymer. As a result of GPC analysis of the obtained polymer, the weight average molecular weight of the polymer was 6,400 relative to standard polystyrene. The obtained polymer is believed to be a polymer having a structural unit of formula (8) and having a structure of formula (2h) at an end:

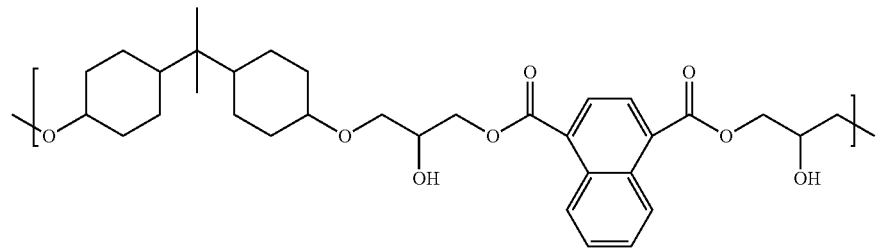

(8)

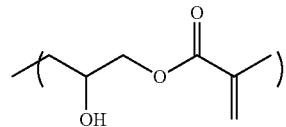

(2h)

Synthesis Example 12

15.00 g of hexahydrophthalic acid diglycidyl ester, 9.86 g of 4-cyclohexene-1,2-dicarboxylic acid, and 1.12 g of benzyltriethylammonium chloride were dissolved in 103.93 g of propylene glycol 1-monomethyl ether 2-acetate, and then the mixture was reacted for 4 hours at 140° C. to give a solution containing a polymer. After cooling to room temperature, 2.36 g of glycidyl methacrylate and 0.09 g of benzyltriethylammonium chloride were dissolved in the solution, and then the mixture was reacted for 3 hours at 140° C. to give a solution containing a polymer. As a result of GPC analysis of the obtained polymer, the weight average molecular weight of the polymer was 2,300 relative to standard polystyrene. The obtained polymer is believed to be a polymer having a structural unit of formula (9) and having a structure of formula (2i) at an end:

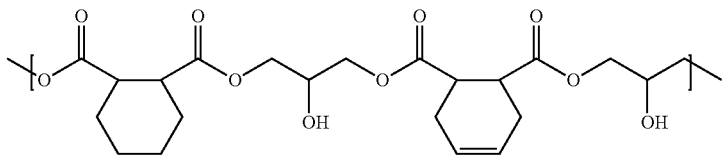

(9)

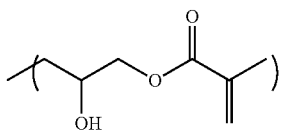

(2i)

Example 1

The solution containing a polymer obtained in Synthesis Example 1 was poured into a bottle filled with a cation exchange resin (15JWET, Organo Corporation) and an anion exchange resin (Monosphere 550A, Muromachi Technos Co., Ltd.), and stirred for 4 hours. To 20 g of the stirred solution, 0.68 g of IRGACURE [registered trademark] 184 (from BASF Ltd.), 4.08 g of tricyclodecanedimethanol diacrylate (from Shin Nakamura Chemical Co., Ltd.), and 0.34 g of pentaerythritol tetrakis(3-mercaptobutyrate) (from Showa Denko K.K.) dissolved in 8.90 g of propylene glycol 1-monomethyl ether 2-acetate were added to prepare a composition. Then, the solution was filtered through a polyethylene microfilter having a pore size of 3 μm to prepare a photocurable resin composition.

Example 2

The solution containing a polymer obtained in Synthesis Example 2 was poured into a bottle filled with a cation exchange resin (15JWET, Organo Corporation) and an anion exchange resin (Monosphere [registered trademark] 550A, Muromachi Technos Co., Ltd.), and stirred for 4 hours. To 22 g of the stirred solution, 0.60 g of IRGACURE 184 (from BASF Ltd.), 3.62 g of tricyclodecanedimethanol diacrylate (from Shin Nakamura Chemical Co., Ltd.), and 0.30 g of pentaerythritol tetrakis(3-mercaptobutyrate) (from Showa Denko K.K.) dissolved in 3.62 g of propylene glycol 1-monomethyl ether 2-acetate were added to prepare a composition. Then, the solution was filtered through a polyethylene microfilter having a pore size of 3 μm to prepare a photocurable resin composition.

Example 3

The solution containing a polymer obtained in Synthesis Example 3 was poured into a bottle filled with a cation exchange resin (15JWET, Organo Corporation) and an anion exchange resin (Monosphere 550A, Muromachi Technos Co., Ltd.), and stirred for 4 hours. To 24 g of the stirred solution, 0.72 g of IRGACURE 184 (from BASF Ltd.), 4.30 g of tricyclodecanedimethanol diacrylate (from Shin Nakamura Chemical Co., Ltd.), and 0.36 g of pentaerythritol tetrakis(3-mercaptobutyrate) (from Showa Denko K.K.) dissolved in 6.48 g of propylene glycol 1-monomethyl ether 2-acetate were added to prepare a composition. Then, the solution was filtered through a polyethylene microfilter having a pore size of 3 μm to prepare a photocurable resin composition.

Example 4

The solution containing a polymer obtained in Synthesis Example 4 was poured into a bottle filled with a cation exchange resin (15JWET, Organo Corporation) and an anion exchange resin (Monosphere 550A, Muromachi Technos Co., Ltd.), and stirred for 4 hours. To 23 g of the stirred solution, 0.72 g of IRGACURE 184 (from BASF Ltd.), 4.35 g of tricyclodecanedimethanol diacrylate (from Shin Nakamura Chemical Co., Ltd.), and 0.36 g of pentaerythritol tetrakis(3-mercaptobutyrate) (from Showa Denko K.K.) dissolved in 7.78 g of propylene glycol 1-monomethyl ether 2-acetate were added to prepare a composition. Then, the solution was filtered through a polyethylene microfilter having a pore size of 3 μm to prepare a photocurable resin composition.

Comparative Example 1

The solution containing a polymer obtained in Synthesis Example 5 was poured into a bottle filled with a cation exchange resin (15JWET, Organo Corporation) and an anion exchange resin (Monosphere 550A, Muromachi Technos Co., Ltd.), and stirred for 4 hours. To 33 g of the stirred solution, 0.93 g of IRGACURE 184 (from BASF Ltd.), 2.78 g of tricyclodecanedimethanol diacrylate (from Shin Nakamura Chemical Co., Ltd.), and 0.46 g of pentaerythritol tetrakis(3-mercaptobutyrate) (from Showa Denko K.K.) dissolved in 0.69 g of cyclohexanone were added to prepare a composition. Then, the solution was filtered through a polyethylene microfilter having a pore size of 3 μm to prepare a photocurable resin composition.

Comparative Example 2

The solution containing a polymer obtained in Synthesis Example 6 was poured into a bottle filled with a cation exchange resin (15JWET, Organo Corporation) and an anion exchange resin (Monosphere 550A, Muromachi Technos Co., Ltd.), and stirred for 4 hours. To 21 g of the stirred solution, 0.65 g of IRGACURE 184 (from BASF Ltd.), 3.91 g of tricyclodecanedimethanol diacrylate (from Shin Nakamura Chemical Co., Ltd.), and 0.33 g of pentaerythritol tetrakis(3-mercaptobutyrate) (from Showa Denko K.K.) dissolved in 6.67 g of propylene glycol 1-monomethyl ether 2-acetate were added to prepare a composition. Then, the solution was filtered through a polyethylene microfilter having a pore size of 3 μm to prepare a photocurable resin composition.

Comparative Example 3

The solution containing a polymer obtained in Synthesis Example 7 was poured into a bottle filled with a cation exchange resin (15JWET, Organo Corporation) and an anion exchange resin (Monosphere 550A, Muromachi Technos Co., Ltd.), and stirred for 4 hours. To 21 g of the stirred solution, 0.57 g of IRGACURE 184 (from BASF Ltd.), 3.44 g of tricyclodecanedimethanol diacrylate (from Shin Nakamura Chemical Co., Ltd.), and 0.29 g of pentaerythritol tetrakis(3-mercaptobutyrate) (from Showa Denko K.K.) dissolved in 4.99 g of propylene glycol 1-monomethyl ether 2-acetate were added to prepare a composition. Then, the solution was filtered through a polyethylene microfilter having a pore size of 3 μm to prepare a photocurable resin composition.

Comparative Example 4

The solution containing a polymer obtained in Synthesis Example 8 was poured into a bottle filled with a cation exchange resin (15JWET, Organo Corporation) and an anion exchange resin (Monosphere 550A, Muromachi Technos Co., Ltd.), and stirred for 4 hours. To 22 g of the stirred solution, 0.71 g of IRGACURE 184 (from BASF Ltd.), 4.26 g of tricyclodecanedimethanol diacrylate (from Shin Nakamura Chemical Co., Ltd.), and 0.35 g of pentaerythritol tetrakis(3-mercaptobutyrate) (from Showa Denko K.K.) dissolved in 8.16 g of propylene glycol 1-monomethyl ether 2-acetate were added to prepare a composition. Then, the solution was filtered through a polyethylene microfilter having a pore size of 3 μm to prepare a photocurable resin composition.

Comparative Example 5

The solution containing a polymer obtained in Synthesis Example 9 was poured into a bottle filled with a cation exchange resin (15JWET, Organo Corporation) and an anion exchange resin (Monosphere 550A, Muromachi Technos Co., Ltd.), and stirred for 4 hours. To 22 g of the stirred solution, 0.67 g of IRGACURE 184 (from BASF Ltd.), 4.03 g of tricyclodecanedimethanol diacrylate (from Shin Nakamura Chemical Co., Ltd.), and 0.34 g of pentaerythritol tetrakis(3-mercaptobutyrate) (from Showa Denko K.K.) dissolved in 6.58 g of propylene glycol 1-monomethyl ether 2-acetate were added to prepare a composition. Then, the solution was filtered through a polyethylene microfilter having a pore size of 3 µm to prepare a photocurable resin composition.

Comparative Example 6

The solution containing a polymer obtained in Synthesis Example 10 was poured into a bottle filled with a cation exchange resin (15JWET, Organo Corporation) and an anion exchange resin (Monosphere 550A, Muromachi Technos Co., Ltd.), and stirred for 4 hours. To 22 g of the stirred solution, 0.72 g of IRGACURE 184 (from BASF Ltd.), 4.29 g of tricyclodecanedimethanol diacrylate (from Shin Nakamura Chemical Co., Ltd.), and 0.36 g of pentaerythritol tetrakis(3-mercaptobutyrate) (from Showa Denko K.K.) dissolved in 8.42 g of propylene glycol 1-monomethyl ether 2-acetate were added to prepare a composition. Then, the solution was filtered through a polyethylene microfilter having a pore size of 3 µm to prepare a photocurable resin composition.

Comparative Example 7

The solution containing a polymer obtained in Synthesis Example 11 was poured into a bottle filled with a cation exchange resin (15JWET, Organo Corporation) and an anion exchange resin (Monosphere 550A, Muromachi Technos Co., Ltd.), and stirred for 4 hours. To 20 g of the stirred solution, 0.60 g of IRGACURE 184 (from BASF Ltd.), 3.58 g of tricyclodecanedimethanol diacrylate (from Shin Nakamura Chemical Co., Ltd.), and 0.30 g of pentaerythritol tetrakis(3-mercaptobutyrate) (from Showa Denko K.K.) dissolved in 5.36 g of propylene glycol 1-monomethyl ether 2-acetate were added to prepare a composition. Then, the solution was filtered through a polyethylene microfilter having a pore size of 3 µm to prepare a photocurable resin composition.

Comparative Example 8

The solution containing a polymer obtained in Synthesis Example 12 was poured into a bottle filled with a cation exchange resin (15JWET, Organo Corporation) and an anion exchange resin (Monosphere 550A, Muromachi Technos Co., Ltd.), and stirred for 4 hours. To 18 g of the stirred solution, 0.60 g of IRGACURE 184 (from BASF Ltd.), 3.62 g of tricyclodecanedimethanol diacrylate (from Shin Nakamura Chemical Co., Ltd.), and 0.30 g of pentaerythritol tetrakis(3-mercaptobutyrate) (from Showa Denko K.K.) dissolved in 7.67 g of propylene glycol 1-monomethyl ether 2-acetate were added to prepare a composition. Then, the solution was filtered through a polyethylene microfilter having a pore size of 3 µm to prepare a photocurable resin composition.

[Measurement of Transmittance]

Each of the photocurable resin compositions prepared in Examples 1 to 4, and Comparative Examples 2, 3, 7 and 8 was applied onto a quartz substrate with a spin coater, pre-baked at 100° C., exposed to light (i-line, exposure dose: 3000 mJ/cm$^2$) with an aligner (PLA-501 from Canon Inc.), further baked at 100° C., and then developed with a mixed solution of propylene glycol 1-monomethyl ether 2-acetate and 1-methoxy-2-propanol to form a film with a film thickness of 10 µm. This film was measured for transmittance at a wavelength of 400 nm with the UV-VIS spectrophotometer UV-2550 (from Shimadzu Corporation). The results are shown in Table 1. In Table 1, a transmittance of 95% or more is denoted by ○, and a transmittance of less than 95% is denoted by x. Furthermore, each of the films formed from the photocurable resin compositions prepared in Examples 1 to 4, and Comparative Examples 2, 3, 7 and 8 was baked for 3 minutes at 265° C., and then the film was measured for transmittance at a wavelength of 400 nm. The results are shown in Table 1. In Table 1, a film having a transmittance after the baking that decreased by 1% or less from the transmittance before the baking for 3 minutes at 265° C. is denoted by ○, and a film having a transmittance after the baking that decreased by more than 1% from the transmittance before the baking for 3 minutes at 265° C. is denoted by x. The results shown in Table 1 below suggest that the films formed from the photocurable resin compositions prepared in Examples 1 to 4 exhibited transmittance higher than that of the films formed from the photocurable resin compositions prepared in Comparative Examples 2 and 3, and had heat resistance at 265° C. higher than that of the films formed from the photocurable resin compositions prepared in Comparative Examples 2, 3, 7 and 8.

TABLE 1

| | Transmittance (Wavelength: 400 nm) | |
|---|---|---|
| | Initial | 265° C. |
| Example 1 | ○ | ○ |
| Example 2 | ○ | ○ |
| Example 3 | ○ | ○ |
| Example 4 | ○ | ○ |
| Comparative Example 2 | x | x |
| Comparative Example 3 | x | x |
| Comparative Example 7 | ○ | x |
| Comparative Example 8 | ○ | x |

[Test of Elution into Solvent]

Each of the photocurable resin compositions prepared in Examples 1 to 4, and Comparative Examples 4 to 6 was applied onto a silicon wafer with a spin coater, pre-baked at 100° C., exposed to light (i-line, exposure dose: 3000 mJ/cm$^2$) with an aligner (PLA-501 from Canon Inc.), further baked at 100° C., and then developed with a mixed solution of propylene glycol 1-monomethyl ether 2-acetate and 1-methoxy-2-propanol to form a film with a film thickness of 10 µm. This film was soaked in N-methyl-2-pyrrolidone for 1 minute at 23° C. The films formed from the photocurable resin compositions prepared in Examples 1 to 4 each containing a polymer having a methacryl group at an end were confirmed to have a change in film thickness of 5% or less before and after the soaking. However, the films formed from the photocurable resin compositions prepared in Comparative Examples 4 to 6 each containing a polymer not end-capped with a structure having an acryloyl or methacryloyl group showed, after the soaking in N-methylpyrrolidone, dissolution of 20% or more of the film thickness before the soaking.

[Moisture Permeability Test]

JIS Z 0208 (Cup Method)

A film of each of the compositions prepared in Examples 1 and 3, and Comparative Example 1 was formed on a Kapton film (from Du Pont-Toray Co., Ltd.), pre-baked at 100° C., exposed to light (i-line, exposure dose: 3000 mJ/cm$^2$) with an aligner (PLA-501 from Canon Inc.), further baked at 100° C., and then developed with a mixed solution of propylene glycol 1-monomethyl ether 2-acetate and 1-methoxy-2-propanol to form an intended film. The moisture permeability was measured as follows: Calcium chloride was put in a moisture permeability measurement cup, and the film prepared with a diameter of 6 cm was placed on the cup. The initial entire mass was measured, and then the film was placed in a constant temperature and humidity chamber at 40° C./90%, and the entire mass after 24 hours was measured. An increase in the mass of water was calculated to evaluate the moisture permeability of the film. The moisture permeability of the film obtained from the composition of Example 1 was 28 g/m$^2$·day, the moisture permeability of the film obtained from the composition of Example 3 was 35 g/m$^2$·day, and the moisture permeability of the film obtained from the composition of Comparative Example 1 was 77 g/m$^2$·day. These results show that the films obtained from the compositions of Examples 1 and 3 were superior in anti-moisture permeation properties to the film obtained from the composition of Comparative Example 1.

[Evaluation of Adhesion]

Each of the photocurable resin compositions prepared in Examples 1 to 4 was applied to a 4-inch silicon wafer with a spin coater, and baked for 3 minutes at 80° C. to form a film with a film thickness of 10 μm. The film was then bonded to a 4-inch glass wafer with a bonding apparatus (VJ-300 from Ayumi Industry Co., Ltd.) at a vacuum of 10 Pa or less, a temperature of 80° C., and a bonding pressure of 175 kg. The wafer was cut into a 1-cm square with a dicing apparatus (DAD321 from DISCO Corporation) to prepare a sample for evaluation of adhesion. Araldite [registered trademark] 2014 (from Huntsman Advanced Materials LLC) was applied to both surfaces of the obtained sample for evaluation of adhesion. Both surfaces were bonded to a dedicated jig for adhesion (shear) measurement, and then the adhesion (shear) was evaluated with an autograph (Autograph AGS-100NX from SHIMADZU Corporation). The adhesion was measured at a tensile rate of 5 mm/min. The results are shown in Table 2 below. In Table 2, an adhesion value of "2000 N or more" means that although a breakage of the sample occurred in the region to which Araldite 2014 was applied, no breakage was found in the region to which each of the photocurable resin compositions prepared in Examples 1 to 4 was applied, and thus, the adhesion of the photocurable resin composition of the present invention is not lower than the value shown in the table. The samples obtained with the photocurable resin compositions prepared in Examples 1 to 4 were confirmed to have sufficient adhesion.

TABLE 2

| | Adhesion (Shear) |
|---|---|
| Example 1 | 2000N or more |
| Example 2 | 2000N or more |

TABLE 2-continued

| | Adhesion (Shear) |
|---|---|
| Example 3 | 2000N or more |
| Example 4 | 2000N or more |

The invention claimed is:

1. A photocurable resin composition comprising:
a polymer with a weight average molecular weight of 1,000 to 50,000, the polymer having a structural unit of formula (1), and having a terminal end-group structure of formula (2):

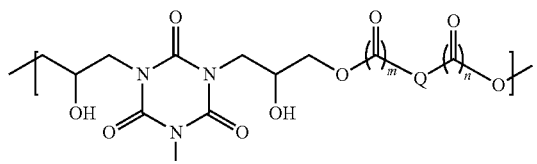

(1)

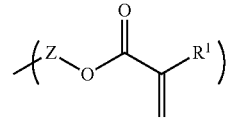

(2)

wherein
X is a methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, —CH═CH$_2$, —CH$_2$—CH═CH$_2$, or

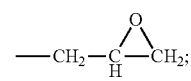

m and n are each independently 0 or 1;
Q is a divalent hydrocarbon group having a carbon atom number of 1 to 16;
Z is a divalent linking group having a carbon atom number of 1 to 4, wherein the divalent linking group is attached to the —O— group in formula (1); and
R$^1$ is a hydrogen atom or methyl group;
a radical photopolymerization initiator; and
a solvent.

2. The photocurable resin composition according to claim 1, wherein the divalent hydrocarbon group of Q in formula (1) is a linear or branched alkylene group, a group containing two carbon atoms connected by a double bond, or a group containing, in a main chain, an alicyclic hydrocarbon group or aromatic hydrocarbon group optionally having at least one substituent.

3. The photocurable resin composition according to claim 1, wherein the divalent linking group of Z in formula (2) is a linear or branched alkylene group optionally having at least one hydroxy group as a substituent.

4. The photocurable resin composition according to claim 1, further comprising a bifunctional (meth)acrylate and/or a polyfunctional thiol.

5. The photocurable resin composition according to claim 1, which is for use as an adhesive or a lens material.

6. A method for forming a film comprising the steps of:
applying the photocurable resin composition according to claim 1 onto a substrate;
pre-baking the photocurable resin composition applied onto the substrate at a temperature of 50 to 160° C.;
exposing a coating film formed on the substrate after the pre-baking to light;
and developing the coating film.

* * * * *